(12) United States Patent
Nakamura

(10) Patent No.: US 9,748,182 B2
(45) Date of Patent: Aug. 29, 2017

(54) WAFER PROCESSING METHOD

(71) Applicant: DISCO CORPORATION, Tokyo (JP)

(72) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/370,638

(22) Filed: Dec. 6, 2016

(65) Prior Publication Data
US 2017/0162521 A1 Jun. 8, 2017

(30) Foreign Application Priority Data

Dec. 7, 2015 (JP) .................. 2015-238875

(51) Int. Cl.
H01L 21/00 (2006.01)
H01L 23/00 (2006.01)
H01L 21/78 (2006.01)
H01L 23/544 (2006.01)
H01L 21/304 (2006.01)
H01L 21/683 (2006.01)
H01L 21/268 (2006.01)
H01L 21/02 (2006.01)
H01L 21/3065 (2006.01)

(52) U.S. Cl.
CPC ...... *H01L 23/562* (2013.01); *H01L 21/02076* (2013.01); *H01L 21/268* (2013.01); *H01L 21/304* (2013.01); *H01L 21/3065* (2013.01); *H01L 21/6836* (2013.01); *H01L 21/78* (2013.01); *H01L 23/544* (2013.01); *H01L 2221/6834* (2013.01); *H01L 2221/68327* (2013.01); *H01L 2221/68386* (2013.01); *H01L 2223/5446* (2013.01)

(58) Field of Classification Search
None
See application file for complete search history.

(56) References Cited

U.S. PATENT DOCUMENTS

| | | | | |
|---|---|---|---|---|
| 8,431,428 B2* | 4/2013 | Sekiya | ................ | B28D 5/0011 |
| | | | | 219/121.61 |
| 9,379,015 B2* | 6/2016 | Matsuzaki | .............. | H01L 21/78 |
| 9,583,391 B2* | 2/2017 | Nakamura | .............. | H01L 21/78 |
| 2013/0302969 A1* | 11/2013 | Priewasser | ............ | H01L 21/784 |
| | | | | 438/458 |

FOREIGN PATENT DOCUMENTS

JP 2002-192370 7/2002

* cited by examiner

*Primary Examiner* — Angel Roman
(74) *Attorney, Agent, or Firm* — Greer Burns & Crain Ltd.

(57) ABSTRACT

Disclosed herein is a wafer processing method including a stacked member removing step of applying a laser beam having an absorption wavelength to a stacked member through a protective film along each division line formed on the front side of a wafer, thereby performing ablation to remove the stacked member present on each division line, a dividing step of applying an external force to the wafer to divide the wafer into individual device chips along each division line where a modified layer is previously formed, and a plasma etching step of supplying an etching gas in a plasma state to the wafer from the front side thereof after performing the stacked member removing step or after performing the dividing step, thereby removing damage due to the ablation in the stacked member removing step.

1 Claim, 15 Drawing Sheets

WAFER PROCESSING METHOD

BACKGROUND OF THE INVENTION

Field of the Invention

The present invention relates to a wafer processing method for dividing a wafer into a plurality of individual device chips along a plurality of crossing division lines formed on the front side of the wafer, the front side of the wafer being partitioned by the division lines to define a plurality of separate regions where a plurality of devices are formed.

Description of the Related Art

In a semiconductor device fabrication process, a plurality of crossing division lines are formed on the front side of a substantially disk-shaped semiconductor wafer to thereby define a plurality of separate regions where a plurality of devices such as integrated circuits (ICs) and large scale integrations (LSIs) are formed. The semiconductor wafer is cut along the division lines to thereby divide the regions where the devices are formed from each other, thus obtaining individual device chips corresponding to the devices.

As a method of dividing a wafer such as a semiconductor wafer along the division lines, there has been put into practical use a laser processing method called internal processing using a pulsed laser beam having a transmission wavelength to the wafer, wherein the pulsed laser beam is applied to the wafer in the condition where the focal point of the pulsed laser beam is set inside the wafer in an area to be divided. A wafer dividing method using this laser processing method includes the steps of applying a pulsed laser beam having a transmission wavelength to the wafer from one side thereof in the condition where the focal point of the pulsed laser beam is set inside the wafer, thereby continuously forming a modified layer inside the wafer along each division line, and next applying an external force to the wafer along each division line where the strength has been reduced by the formation of the modified layer, thereby breaking the wafer along each division line to divide the wafer into the individual device chips (see Japanese Patent No. 3408805, for example).

Further, a semiconductor wafer intended to improve the processing performance of semiconductor devices such as ICs and LSIs has been put into practical use. This semiconductor wafer is composed of a substrate such as a silicon substrate and a functional layer formed on the front side of the substrate, wherein the functional layer is composed of a low-permittivity insulator film (low-k film) and a functional film formed on the low-k film, the functional film forming a plurality of circuits. Thus, the semiconductor devices are formed from the functional layer. The low-k film is formed from an inorganic film of SiOF, BSG (SiOB), etc. or an organic film such as a polymer film of polyimide, parylene, etc. However, the low-k film is very brittle like mica. Accordingly, in the case of using such a wafer having a functional layer formed on the front side of a substrate such as a silicon substrate, wherein the functional layer includes a low-k film, and then forming a modified layer inside this wafer (substrate) along each division line to apply an external force to the wafer, thereby dividing the wafer along each division line, there arises a problem such that the low-k film may be separated and this separation (delamination) may reach the devices to cause fatal damage to the devices.

Further, known is a wafer having a metal film called test element group (TEG) for testing the function of each device, wherein the metal film is formed on a part of each division line. In the case of forming a modified layer inside such a wafer along each division line and applying an external force to the wafer, there arises a problem such that the devices divided from each other may be connected through the metal film, so that the individual device chips cannot be obtained.

To solve these problems, there has been proposed a processing method such that a laser beam is applied along each division line to perform ablation to the low-k film or the metal film as a stacked member formed on each division line, thereby removing the stacked member.

SUMMARY OF THE INVENTION

In the case of applying a laser beam along each division line to remove the stacked member formed on each division line by ablation as mentioned above, the above problems can be solved. However, there arises a problem such that damage such as thermal stress and cracks due to the ablation may be left in the wafer, causing a reduction in die strength of each device.

It is therefore an object of the present invention to provide a wafer processing method which can divide a wafer into individual device chips along each division line without reducing the die strength of each device, wherein the wafer has a stacked member formed on each division line.

In accordance with an aspect of the present invention, there is provided a wafer processing method for dividing a wafer into a plurality of individual device chips along a plurality of crossing division lines formed on the front side of the wafer, the front side of the wafer being partitioned by the division lines to define a plurality of separate regions where a plurality of devices are formed, the individual device chips corresponding to the devices, the wafer having a stacked member formed on each division line, the wafer processing method including a protective member attaching step of attaching a protective member to the front side of the wafer; a back grinding step of grinding the back side of the wafer after performing the protective member attaching step, thereby reducing the thickness of the wafer to a predetermined thickness; a modified layer forming step of applying a laser beam having a transmission wavelength to the wafer from the back side thereof along each division line in the condition where the focal point of the laser beam is set inside the wafer after performing the back grinding step, thereby forming a modified layer inside the wafer along each division line; a wafer supporting step of attaching the back side of the wafer to an adhesive tape supported at its peripheral portion to an annular frame having an inside opening capable of receiving the wafer after performing the modified layer forming step, thereby supporting the wafer through the adhesive tape to the annular frame, and next peeling the protective member from the front side of the wafer; a protective film forming step of applying a water-soluble resin to the front side of the wafer after performing the wafer supporting step, thereby forming a protective film from the water-soluble resin; a stacked member removing step of applying a laser beam having an absorption wavelength to the stacked member through the protective film along each division line after performing the protective film forming step, thereby performing ablation to remove the stacked member present on each division line; a dividing step of applying an external force to the wafer after performing the stacked member removing step, thereby dividing the wafer into the individual device chips along each division line where the modified layer is formed; a protective film removing step of cleaning the front side of the wafer after performing the dividing step, thereby removing the protective film from the front side of the wafer; and a plasma etching step of supplying an etching gas in a plasma state to the wafer from the front side thereof after performing the stacked member removing step or after performing the dividing step, thereby removing damage due to the ablation in the stacked member removing step.

As described above, the wafer processing method of the present invention includes the stacked member removing step of applying a laser beam having an absorption wavelength to the stacked member through the protective film along each division line, thereby performing ablation to remove the stacked member present on each division line, the dividing step of applying an external force to the wafer to thereby divide the wafer into the individual device chips along each division line where the modified layer is previously formed, and the plasma etching step of supplying an etching gas in a plasma state to the wafer from the front side thereof after performing the stacked member removing step or after performing the dividing step, thereby removing damage due to the ablation in the stacked member removing step. Accordingly, it is possible to solve the problem that the die strength of each device may be reduced by the damage such as thermal stress and cracks left due to the ablation.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the wafer processing method according to the present invention will now be described in detail with reference to the attached drawings.

Figure 1A:
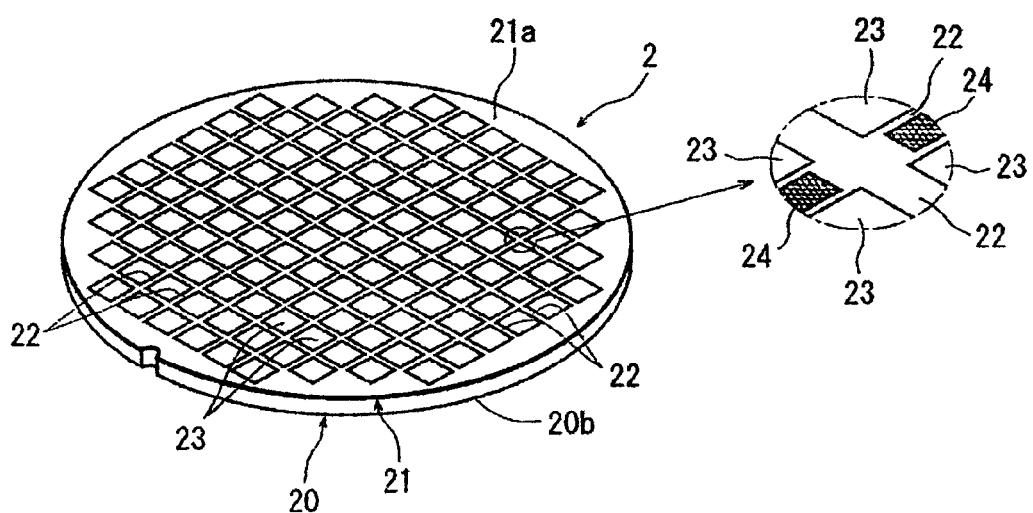
FIG. 1A is a perspective view of a semiconductor wafer.
Figure 1B:
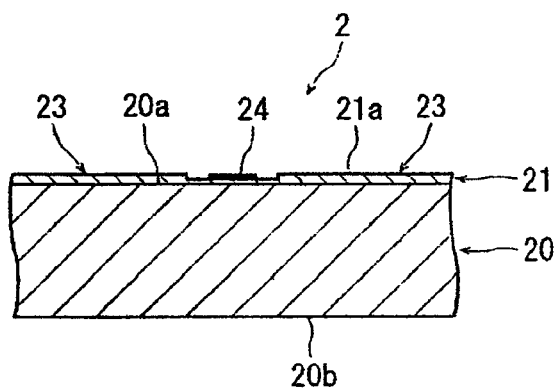
FIG. 1B is an enlarged sectional view of an essential part of the semiconductor wafer shown in FIG. 1A.

FIG. 1A is a perspective view of a semiconductor wafer 2 to be processed by the wafer processing method according to the present invention, and FIG. 1B is an enlarged sectional view of an essential part of the semiconductor wafer 2 shown in FIG. 1A. As shown in FIGS. 1A and 1B, the semiconductor wafer 2 is composed of a substrate 20 such as a silicon substrate and a functional layer 21 (stacked member) formed on the front side 20a of the substrate 20. For example, the substrate 20 has a thickness of 600 µm. The functional layer 21 is composed of an insulating film and a functional film formed on the insulating film, the functional film forming a plurality of circuits. A plurality of crossing division lines 22 are formed on the front side 21a of the functional layer 21 to thereby define a plurality of separate regions where a plurality of devices 23 such as ICs and LSIs are formed. In this preferred embodiment, the insulating film constituting the functional layer 21 is provided by an $SiO_2$ film or a low-permittivity insulator film (low-k film). Examples of the low-k film include an inorganic film of SiOF, BSG (SiOB), etc. and an organic film such as a polymer film of polyimide, parylene, etc. For example, the functional layer 21 has a thickness of 10 µm. Further, a plurality of metal films 24 for testing the function of the devices 23 are provided on a part of each division line 22. The metal films 24 are called TEG and they are formed of copper (Cu) or aluminum (Al). In this preferred embodiment, the metal films 24 are included in the stacked member.

Figure 2A:
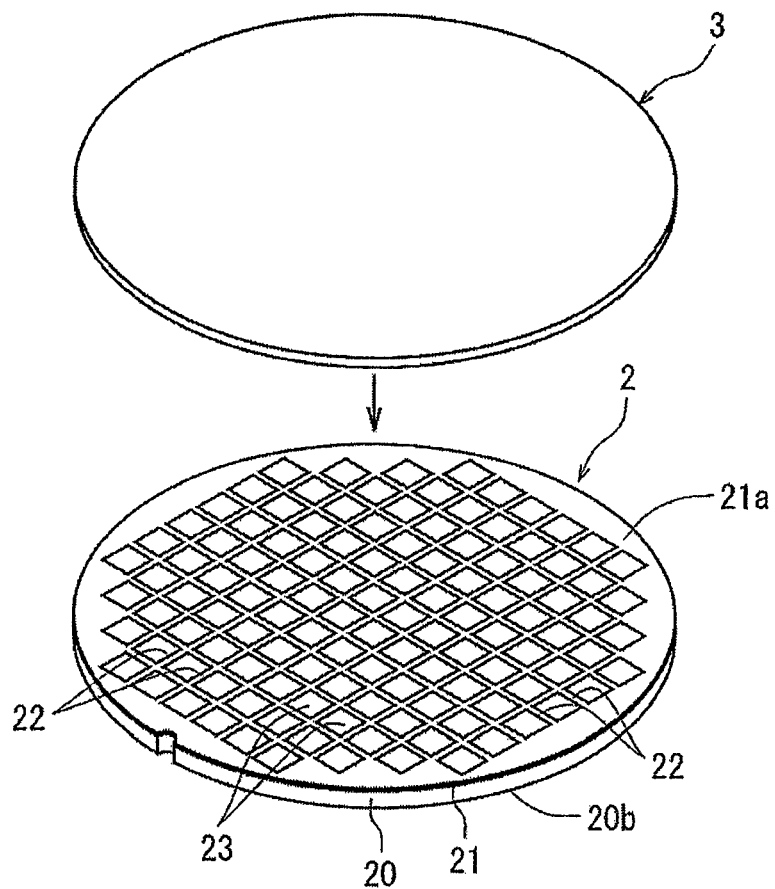
FIGS. 2A and 2B are perspective views for illustrating a protective member attaching step.
Figure 2B:
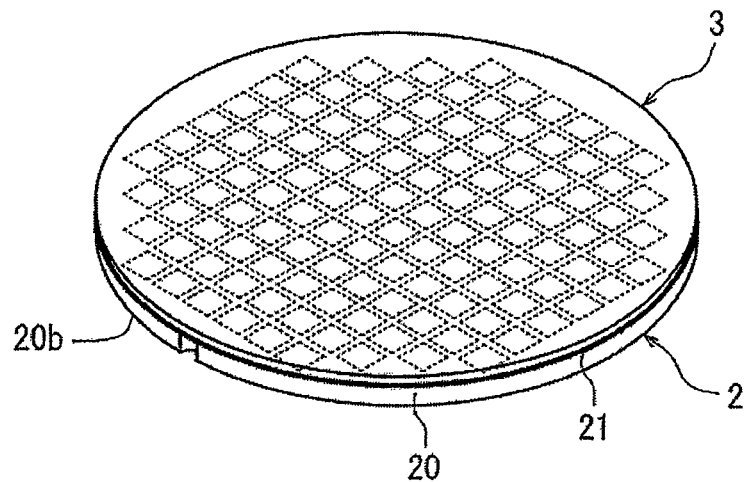

The wafer processing method for dividing the semiconductor wafer 2 into individual device chips along the division lines 22 will now be described. First, as shown in FIGS. 2A and 2B, a protective tape 3 as a protective member is attached to the front side 21a of the functional layer 21 formed on the substrate 20 of the semiconductor wafer 2, so as to protect the devices 23 (protective member attaching step). In this preferred embodiment, the protective tape 3 is composed of a base sheet and an adhesive layer formed on the front side of the base sheet. For example, the base sheet is formed of polyvinyl chloride (PVC) and has a thickness of 100 µm, and the adhesive layer is formed of acrylic resin and has a thickness of approximately 5 µm.

After performing the protective member attaching step mentioned above, a back grinding step is performed in such a manner that the back side 20b of the substrate 20 of the semiconductor wafer 2 is ground to reduce the thickness of the semiconductor wafer 2 to a predetermined thickness. This back grinding step is performed by using a grinding apparatus 4 shown in FIG. 3A. The grinding apparatus 4 shown in FIG. 3A includes a chuck table 41 for holding a workpiece and grinding means 42 for grinding the workpiece held on the chuck table 41. The chuck table 41 has an upper surface as a holding surface for holding the workpiece thereon under suction. The chuck table 41 is rotatable in the direction shown by an arrow 41a in FIG. 3A by a rotational drive mechanism (not shown). The grinding means 42 includes a spindle housing 421, a spindle 422 rotatably supported to the spindle housing 421 and adapted to be rotated by a rotational drive mechanism (not shown), a mounter 423 fixed to the lower end of the spindle 422, and a grinding wheel 424 mounted on the lower surface of the mounter 423. The grinding wheel 424 is composed of an annular base 425 and a plurality of abrasive members 426 fixed to the lower surface of the annular base 425 so as to be annularly arranged along the outer circumference thereof. The annular base 425 is mounted on the lower surface of the mounter 423 by a plurality of fastening bolts 427.

Figure 3A:
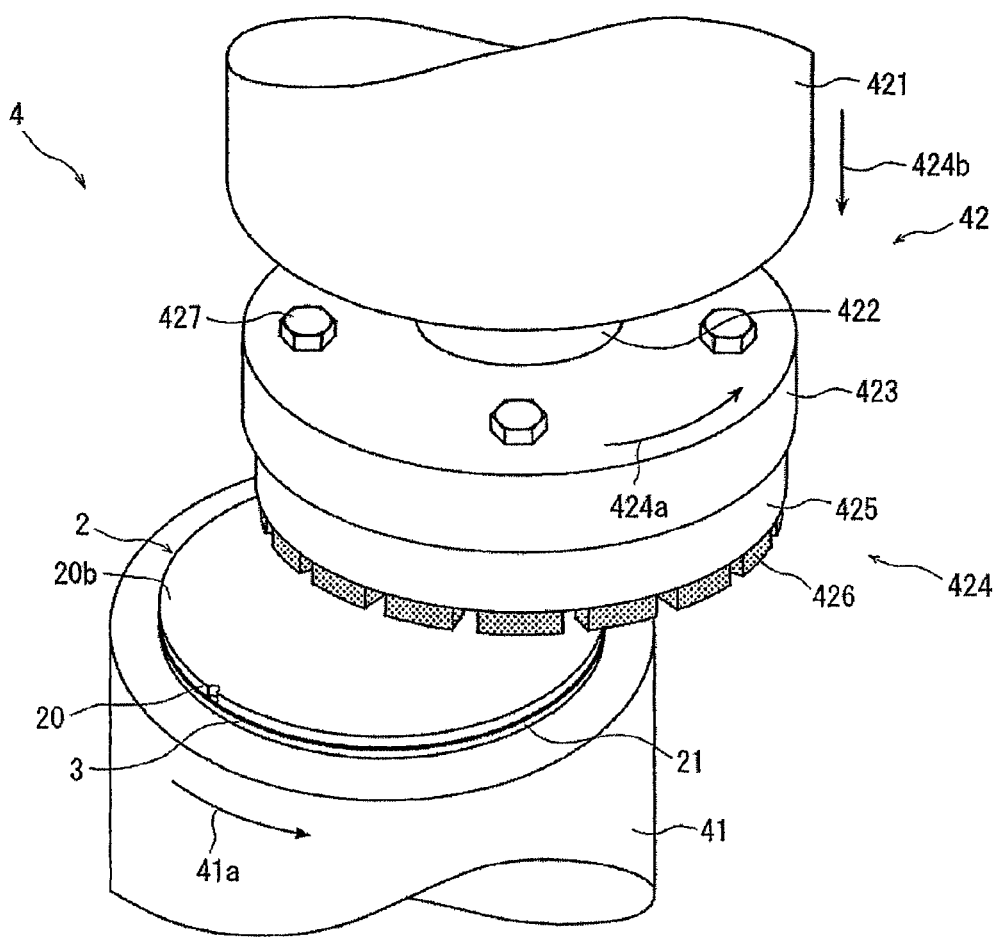
FIGS. 3A and 3B are views for illustrating a back grinding step.
Figure 3B:
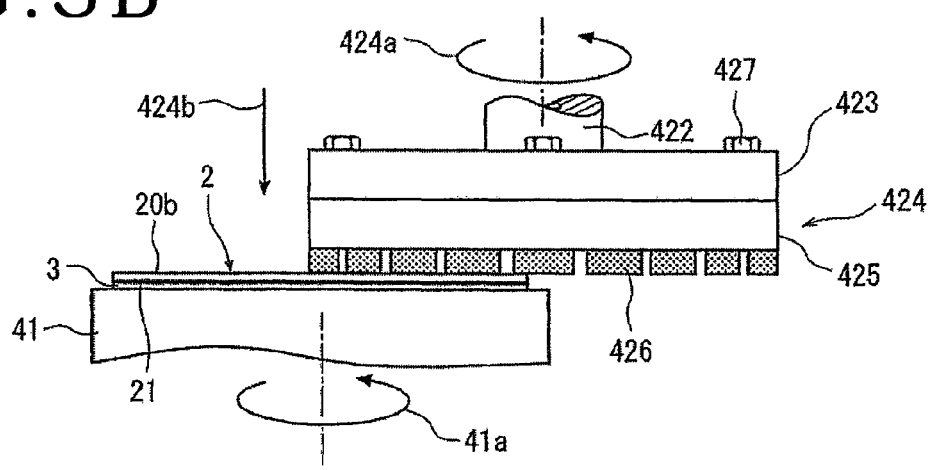

In performing the back grinding step by using the grinding apparatus 4 mentioned above, the semiconductor wafer 2 is placed on the chuck table 41 in the condition where the protective tape 3 attached to the semiconductor wafer 2 is in contact with the upper surface (holding surface) of the chuck table 41 as shown in FIG. 3A. Thereafter, suction means (not shown) is operated to hold the semiconductor wafer 2 through the protective tape 3 on the chuck table 41 under suction (wafer holding step). Accordingly, the semiconductor wafer 2 is held through the protective tape 3 on the chuck table 41 under suction in the condition where the back side 20b of the substrate 20 is oriented upward. After holding the semiconductor wafer 2 through the protective tape 3 on the chuck table 41 under suction as mentioned above, the chuck table 41 is rotated in the direction of the arrow 41a in FIG. 3A at 300 rpm, for example. At the same time, the grinding wheel 424 of the grinding means 42 is also rotated in the direction shown by an arrow 424a in FIG. 3A at 6000 rpm, for example. Thereafter, the grinding means 42 is lowered to bring the abrasive members 426 of the grinding wheel 424 into contact with the back side 20b (work surface) of the substrate 20 of the semiconductor wafer 2 as shown in FIG. 3B. Thereafter, the grinding wheel 424 is fed (lowered) in the direction shown by an arrow 424b in FIGS. 3A and 3B (in the direction perpendicular to the holding surface of the chuck table 41) by a predetermined amount at a feed speed of 1 μm/second, for example. As a result, the back side 20b of the substrate 20 of the semiconductor wafer 2 is ground to reduce the thickness of the semiconductor wafer 2 to a predetermined thickness (e.g., 100 μm).

After performing the back grinding step mentioned above, a modified layer forming step is performed in such a manner that a laser beam having a transmission wavelength to the semiconductor wafer 2 (the substrate 20) is applied to the semiconductor wafer 2 from the back side thereof along each division line 22 in the condition where the focal point of the laser beam is set inside the semiconductor wafer 2 (the substrate 20), thereby forming a modified layer inside the semiconductor wafer 2 (the substrate 20) along each division line 22. This modified layer forming step is performed by using a laser processing apparatus 5 shown in FIG. 4. The laser processing apparatus 5 shown in FIG. 4 includes a chuck table 51 for holding a workpiece, laser beam applying means 52 for applying a laser beam to the workpiece held on the chuck table 51, and imaging means 53 for imaging the workpiece held on the chuck table 51. The chuck table 51 has an upper surface as a holding surface for holding the workpiece thereon under suction. The chuck table 51 is movable both in the feeding direction shown by an arrow X in FIG. 4 by feeding means (not shown) and in the indexing direction shown by an arrow Y in FIG. 4 by indexing means (not shown).

The laser beam applying means 52 includes a cylindrical casing 521 extending in a substantially horizontal direction. Although not shown, the casing 521 contains pulsed laser beam oscillating means including a pulsed laser oscillator and repetition frequency setting means. The laser beam applying means 52 further includes focusing means 522 mounted on the front end of the casing 521 for focusing a pulsed laser beam oscillated by the pulsed laser beam oscillating means. The laser beam applying means 52 further includes focal position adjusting means (not shown) for adjusting the focal position of the pulsed laser beam to be focused by the focusing means 522.

The imaging means 53 is mounted on a front end portion of the casing 521 constituting the laser beam applying means 52. The imaging means 53 includes an ordinary imaging device (charge-coupled device (CCD)) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 53 is transmitted to control means (not shown).

Figure 4:
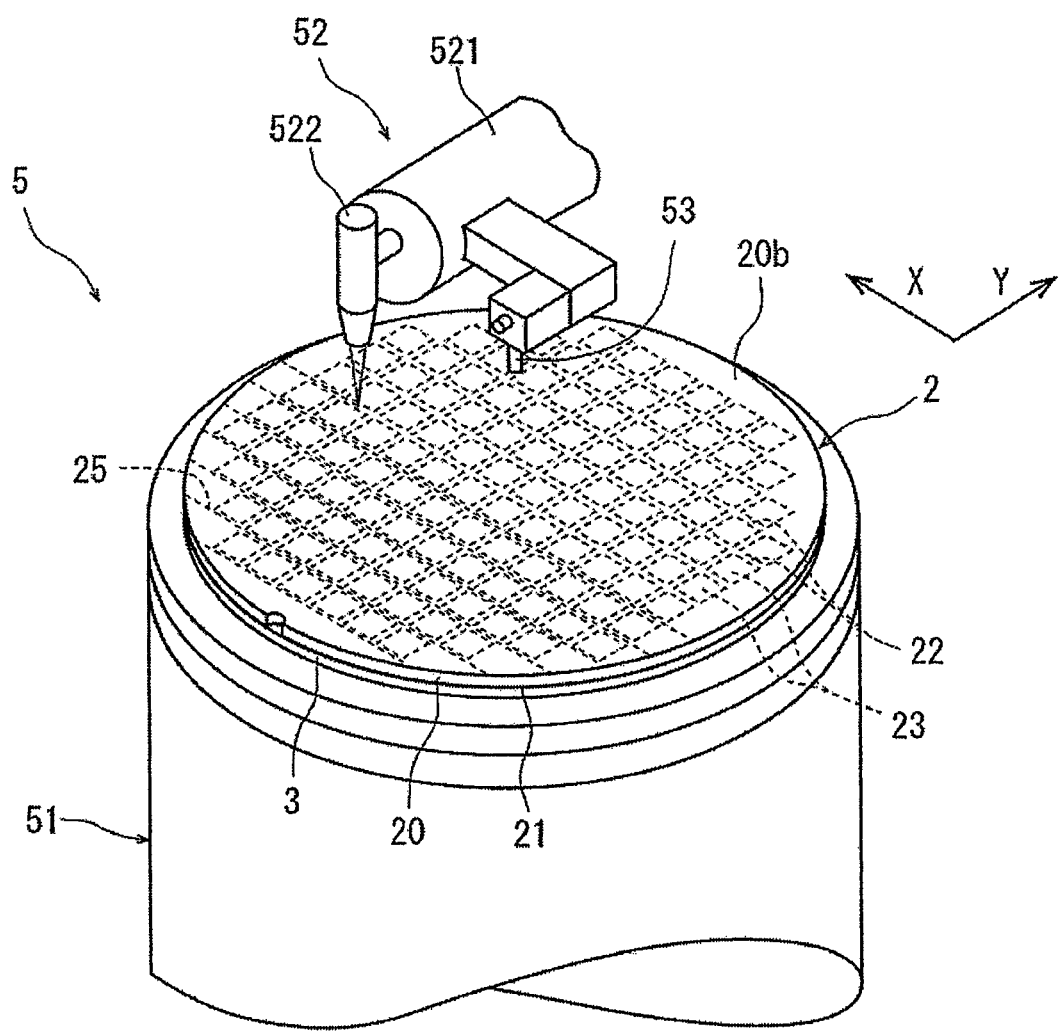
FIG. 4 is a perspective view of an essential part of a laser processing apparatus for performing a modified layer forming step.

The modified layer forming step using the laser processing apparatus 5 mentioned above will now be described with reference to FIG. 4 and FIGS. 5A to 5C. The semiconductor wafer 2 processed by the back grinding step is first placed on the chuck table 51 of the laser processing apparatus 5 shown in FIG. 4 in the condition where the protective tape 3 attached to the front side 21a of the functional layer 21 of the semiconductor wafer 2 is in contact with the upper surface of the chuck table 51 as shown in FIG. 4. Thereafter, suction means (not shown) is operated to hold the semiconductor wafer 2 through the protective tape 3 on the chuck table 51 under suction (wafer holding step). Accordingly, the back side 20b of the substrate 20 of the semiconductor wafer 2 held on the chuck table 51 is oriented upward. Thereafter, the chuck table 51 holding the semiconductor wafer 2 is moved to a position directly below the imaging means 53 by operating the feeding means (not shown).

In the condition where the chuck table 51 is positioned directly below the imaging means 53, an alignment operation is performed by the imaging means 53 and the control means (not shown) to detect a subject area of the semiconductor wafer 2 to be laser-processed. More specifically, the imaging means 53 and the control means perform image processing such as pattern matching for making the alignment of the division lines 22 extending in a first direction and the focusing means 522 of the laser beam applying means 52 for applying the laser beam to the semiconductor wafer 2 along the division lines 22 from the back side 20b of the substrate 20, thus performing the alignment of a laser beam applying position (alignment step). Similarly, the alignment of a laser beam applying position is performed for the other division lines 22 extending in a second direction perpendicular to the first direction on the semiconductor wafer 2. Although the front side 21a of the functional layer 21 where the division lines 22 are formed is present below the substrate 20 of the semiconductor wafer 2 held on the chuck table 51, the division lines 22 can be imaged through the substrate 20 from the back side 20b thereof because the imaging means 53 includes the infrared light applying means for applying infrared light, the optical system for capturing the infrared light, and the imaging device (infrared CCD) for outputting an electrical signal corresponding to the infrared light.

Figure 5A:
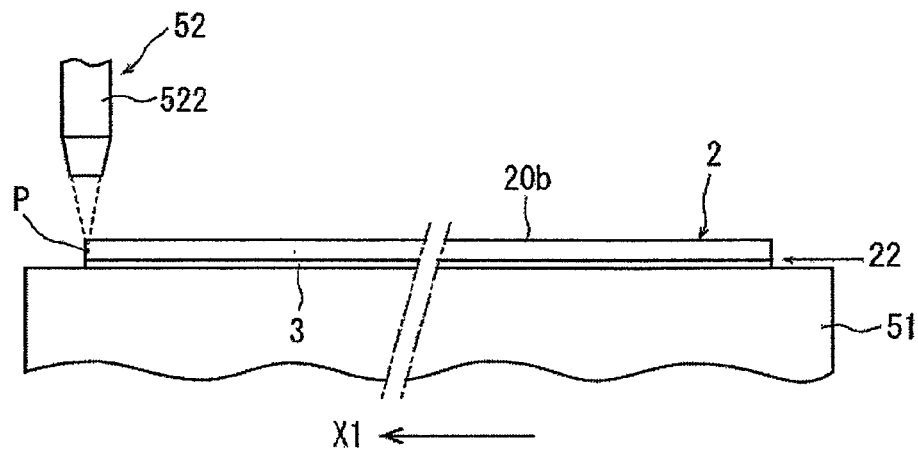
FIGS. 5A to 5C are views for illustrating the modified layer forming step.
Figure 5B:
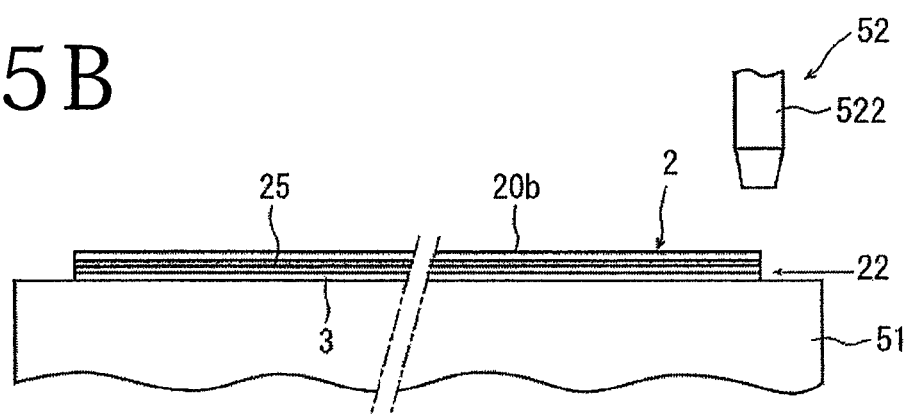
Figure 5C:
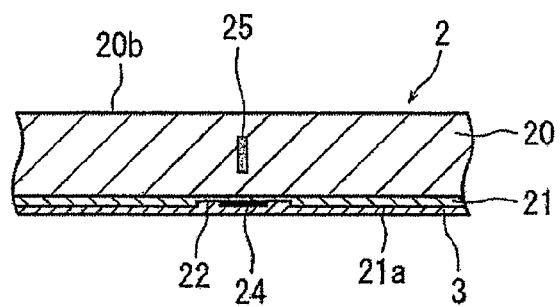

After performing the alignment step mentioned above to detect all the division lines 22 of the semiconductor wafer 2 held on the chuck table 51, the chuck table 51 is moved to a laser beam applying area where the focusing means 522 of the laser beam applying means 52 is located as shown in FIG. 5A, thereby positioning a predetermined one of the division lines 22 extending in the first direction directly below the focusing means 522. At this time, one end (left end as viewed in FIG. 5A) of the predetermined division line 22 is positioned directly below the focusing means 522 as shown in FIG. 5A. At one end of the predetermined division line 22, the lateral center of the predetermined division line 22 in the width direction thereof (in the indexing direction) is positioned directly below the focusing means 522. Further, the focal point P of a pulsed laser beam to be applied from the focusing means 522 is set at the intermediate position in the thickness direction of the substrate 20 of the semiconductor wafer 2 as shown in FIG. 5A. Thereafter, the pulsed laser beam having a transmission wavelength to the substrate 20 is applied from the focusing means 522 to the semiconductor wafer 2, and the chuck table 51 is moved in the direction shown by an arrow X1 in FIG. 5A at a predetermined feed speed. When the other end (right end as viewed in FIG. 5B) of the predetermined division line 22 reaches the position directly below the focusing means 522, the application of the pulsed laser beam is stopped and the movement of the chuck table 51 is also stopped. As a result, a modified layer 25 is formed inside the substrate 20 of the semiconductor wafer 2 along the predetermined division line 22 as shown in FIGS. 5B and 5C.

This modified layer forming step is similarly performed along all of the other division lines 22 extending in the first direction on the front side 21a of the functional layer 21 of the semiconductor wafer 2. Thereafter, the chuck table 51 is rotated 90 degrees to similarly perform the modified layer forming step along all of the other division lines 22 extending in the second direction perpendicular to the first direction.

For example, the modified layer forming step mentioned above is performed under the following processing conditions.

Figure 6:
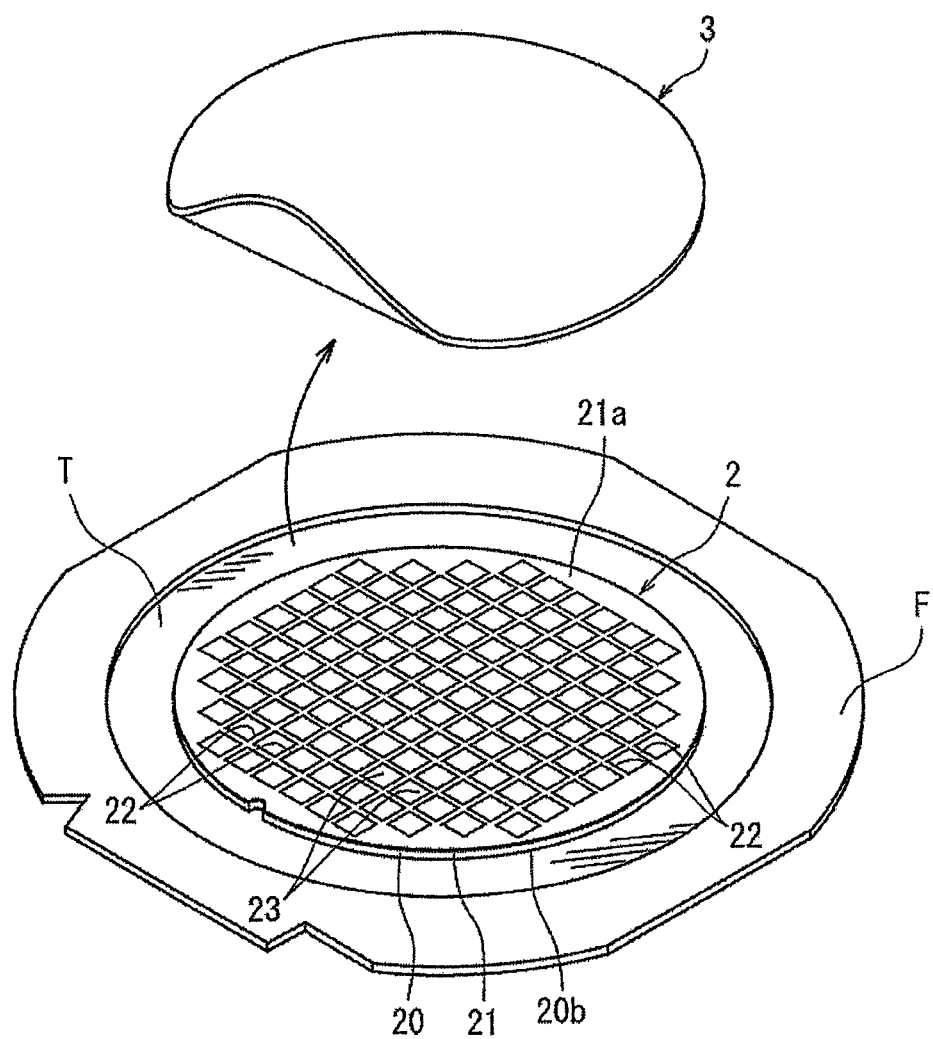
FIG. 6 is a perspective view for illustrating a wafer supporting step.

Wavelength of the laser beam: 1064 nm
Repetition frequency: 40 kHz
Power: 0.5 W
Focused spot diameter: 1 μm
Work feed speed: 400 mm/second After performing the modified layer forming step mentioned above, a wafer supporting step is performed in such a manner that the back side of the semiconductor wafer 2 is attached to an adhesive tape supported at its peripheral portion to an annular frame having an inside opening capable of receiving the semiconductor wafer 2, thereby supporting the semiconductor wafer 2 through the adhesive tape to the annular frame and that the protective member (the protective tape 3) is next peeled from the front side of the semiconductor wafer 2. More specifically, as shown in FIG. 6, an adhesive tape T is preliminarily supported at its peripheral portion to an annular frame F having an inside opening, so that the inside opening of the annular frame F is closed by the adhesive tape T. In this condition, the back side 20b of the substrate 20 of the semiconductor wafer 2 processed by the modified layer forming step is attached to the front side (adhesive side) of the adhesive tape T exposed to the inside opening of the annular frame F. Further, the protective tape 3 is next peeled from the front side 21a of the functional layer 21 of the semiconductor wafer 2. While the back side 20b of the substrate 20 of the semiconductor wafer 2 is attached to the adhesive tape T preliminarily supported at its peripheral portion to the annular frame F in this preferred embodiment shown in FIG. 6, the adhesive tape T may be attached to the back side 20b of the substrate 20 of the semiconductor wafer 2 and at the same time the peripheral portion of the adhesive tape T may be mounted to the annular frame F.

Figure 7A:
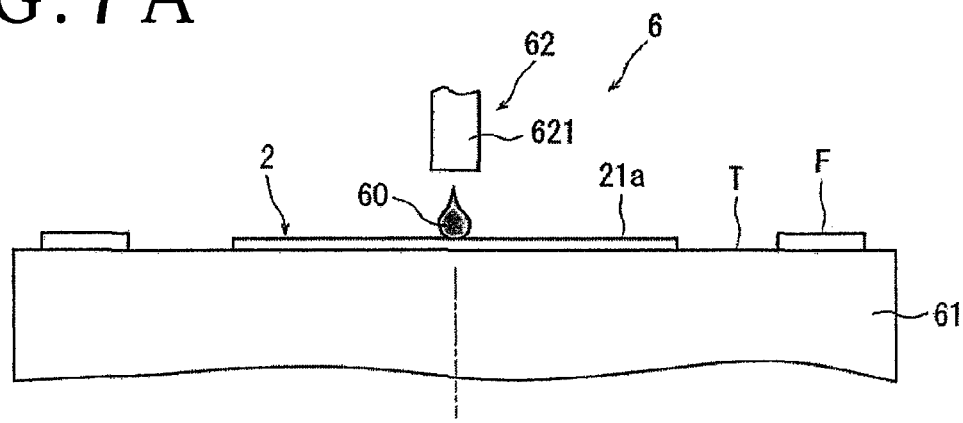
FIGS. 7A to 7C are views for illustrating a protective film forming step.

After performing the wafer supporting step mentioned above, a protective film forming step is performed in such a manner that a water-soluble resin is applied to the front side of the semiconductor wafer 2 to form a protective film from the water-soluble resin. This protective film forming step is performed by using a protective film forming apparatus 6 shown in FIG. 7A. The protective film forming apparatus 6 includes a spinner table 61 for holding the semiconductor wafer 2 and liquid resin supplying means 62 having a liquid resin nozzle 621 for supplying a water-soluble liquid resin 60 to the front side of the semiconductor wafer 2. First, the semiconductor wafer 2 supported through the adhesive tape T to the annular frame F is placed on the spinner table 61 in the condition where the adhesive tape T is in contact with the upper surface of the spinner table 61. Thereafter, suction means (not shown) is operated to hold the semiconductor wafer 2 through the adhesive tape T on the spinner table 61 under suction. Accordingly, the semiconductor wafer 2 is held through the adhesive tape T on the spinner table 61 in the condition where the front side 21a of the functional layer 21 is oriented upward. Thereafter, the water-soluble liquid resin 60 is dropped in a predetermined amount from the liquid resin nozzle 621 of the liquid resin supplying means 62 located above the spinner table 61 to the center of the front side 21a of the functional layer 21 of the semiconductor wafer 2. Examples of the water-soluble liquid resin 60 include polyvinyl alcohol (PVA), polyethylene glycol (PEG), and polyethylene oxide (PEO). In the case that the diameter of the semiconductor wafer 2 is 200 mm, the amount of the water-soluble liquid resin 60 to be supplied is set to approximately 10 mL to 20 mL.

Figure 7B:
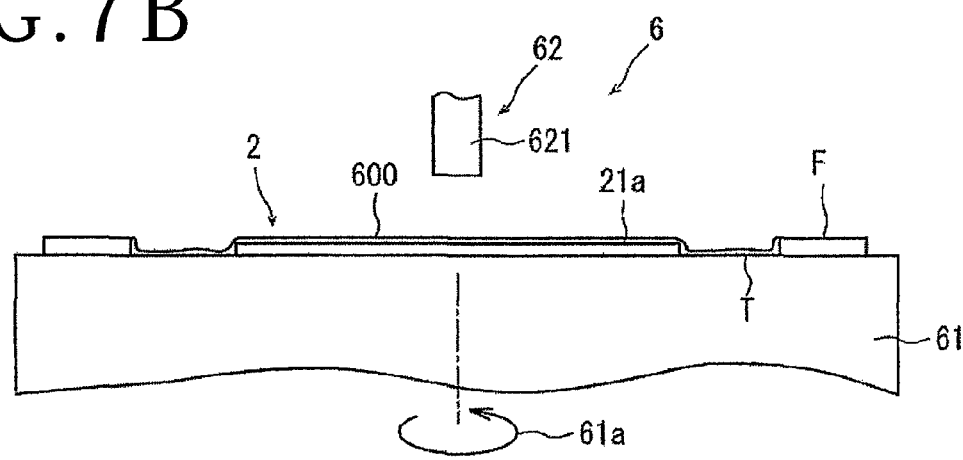
Figure 7C:
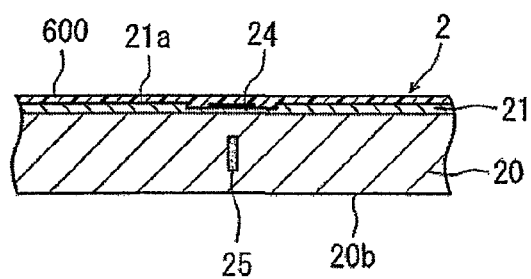

After dropping the predetermined amount of water-soluble liquid resin 60 to the center of the front side 21a of the functional layer 21 of the semiconductor wafer 2 as mentioned above, the spinner table 61 is rotated in the direction shown by an arrow 61a in FIG. 7B at 100 rpm for approximately 5 seconds, for example. As a result, the water-soluble liquid resin 60 dropped onto the center of the front side 21a of the functional layer 21 of the semiconductor wafer 2 is spread on the whole area of the front side 21a of the functional layer 21 of the semiconductor wafer 2 toward the outer circumference thereof by a centrifugal force, thereby forming a protective film 600 having a thickness of 0.2 μm to 10 μm from the water-soluble resin on the front side 21a of the functional layer 21 as shown in FIGS. 7B and 7C (protective film forming step). The thickness of the protective film 600 may be adjusted according to the amount of the water-soluble liquid resin 60 to be supplied, the rotational speed of the spinner table 61, and the rotational time duration of the spinner table 61.

After performing the protective film forming step mentioned above, a stacked member removing step is performed in such a manner that a laser beam having an absorption wavelength to the stacked member including the functional layer 21 and the metal films 24 is applied through the protective film 600 to the semiconductor wafer 2 along each division line 22, thereby performing ablation to remove the stacked member present on each division line 22. This stacked member removing step is performed by using a laser processing apparatus 50 shown in FIG. 8. The laser processing apparatus 50 shown in FIG. 8 is similar in configuration to the laser processing apparatus 5 shown in FIG. 4.

Accordingly, the same parts are denoted by the same reference symbols and the detailed description thereof will be omitted herein.

Figure 8:
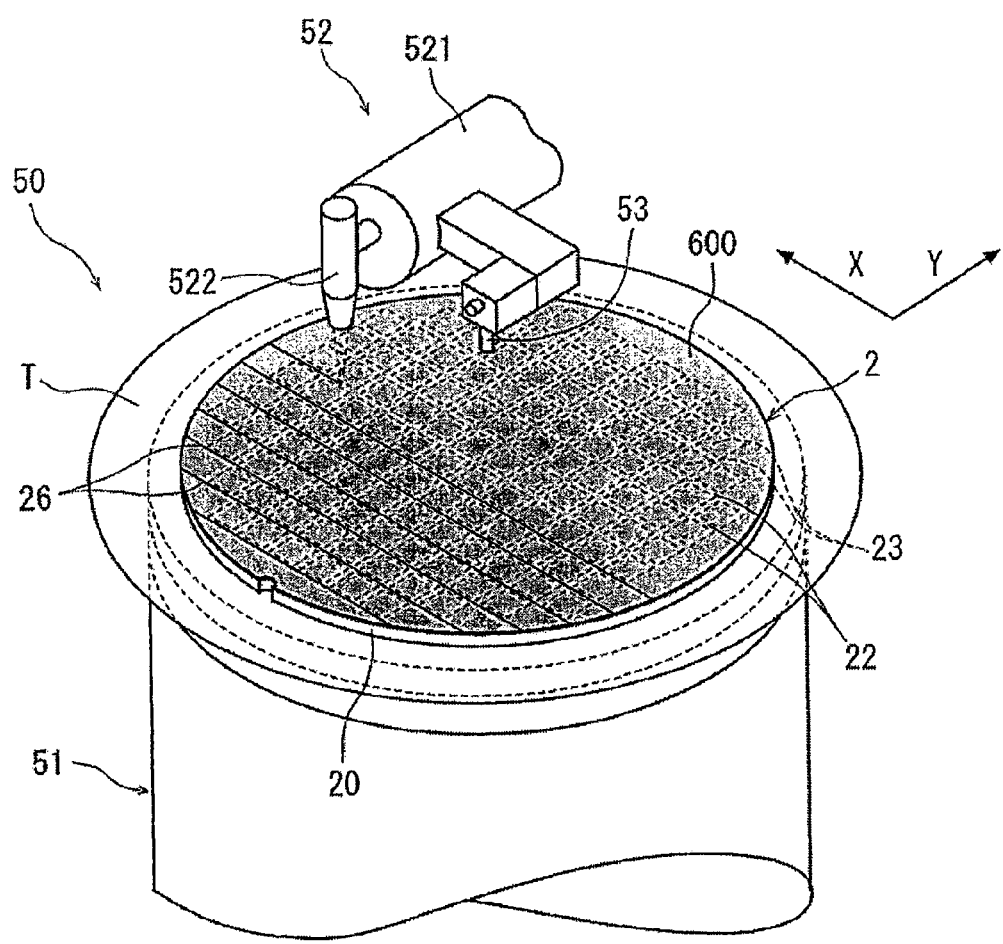
FIG. 8 is a perspective view of an essential part of a laser processing apparatus for performing a stacked member removing step.

In performing the stacked member removing step using the laser processing apparatus 50, the semiconductor wafer 2 processed by the protective film forming step is first placed on the chuck table 51 of the laser processing apparatus 50 in the condition where the adhesive tape T attached to the back side 20b of the substrate 20 of the semiconductor wafer 2 is in contact with the upper surface of the chuck table 51 as shown in FIG. 8. Thereafter, suction means (not shown) is operated to hold the semiconductor wafer 2 through the adhesive tape T on the chuck table 51 under suction (wafer holding step). Accordingly, the semiconductor wafer 2 is held through the adhesive tape T on the chuck table 51 in the condition where the protective film 600 formed on the front side 21a of the functional layer 21 is oriented upward. While the annular frame F supporting the semiconductor wafer 2 through the adhesive tape T is not shown in FIG. 8, the annular frame F is fixed by clamps (not shown) provided on the outer circumference of the chuck table 51. Thereafter, the chuck table 51 holding the semiconductor wafer 2 is moved to a position directly below the imaging means 53 of the laser processing apparatus 50 by operating the feeding means (not shown).

In the condition where the chuck table 51 is positioned directly below the imaging means 53, an alignment operation is performed by the imaging means 53 and the control means (not shown) to detect a subject area of the semiconductor wafer 2 to be laser-processed. More specifically, the imaging means 53 and the control means perform image processing such as pattern matching for making the alignment of the division lines 22 extending in the first direction and the focusing means 522 of the laser beam applying means 52 of the laser processing apparatus 50, thus performing the alignment of a laser beam applying position (alignment step). Similarly, the alignment of a laser beam applying position is performed for the other division lines 22 extending in the second direction perpendicular to the first direction. In the case that the protective film 600 formed on the front side 21a of the functional layer 21 where the division lines 22 are formed is not transparent, the division lines 22 may be imaged by using infrared light from the upper side of the protective film 600.

Figure 9A:
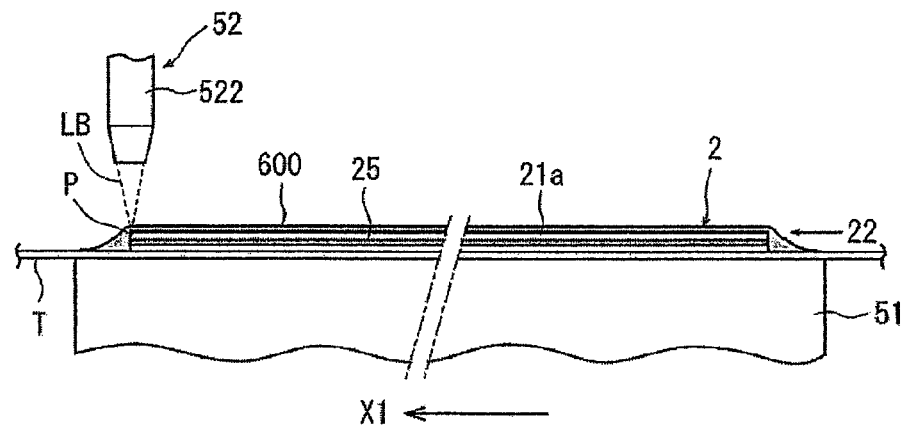
FIGS. 9A to 9C are views for illustrating the stacked member removing step.
Figure 9B:
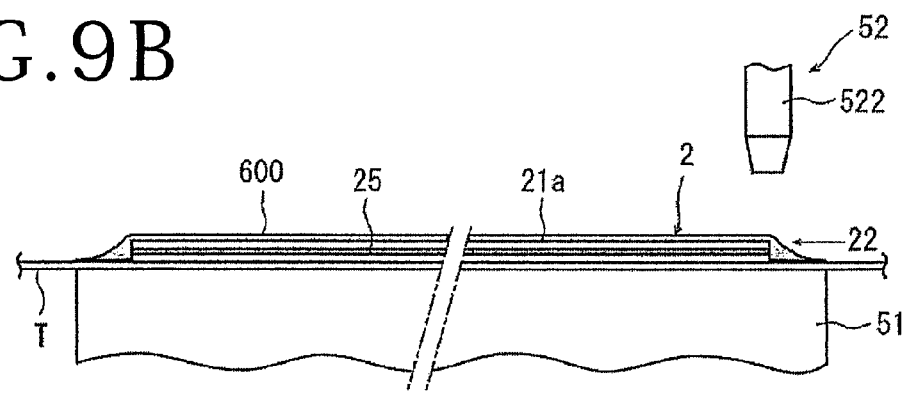

After performing the alignment step mentioned above, the chuck table 51 is moved to a laser beam applying area where the focusing means 522 of the laser beam applying means 52 is located as shown in FIG. 9A, thereby positioning a predetermined one of the division lines 22 extending in the first direction directly below the focusing means 522. At this time, one end (left end as viewed in FIG. 9A) of the predetermined division line 22 is positioned directly below the focusing means 522 as shown in FIG. 9A. At one end of the predetermined division line 22, the lateral center of the predetermined division line 22 in the width direction thereof (in the indexing direction) is positioned directly below the focusing means 522. Further, the focal point P of a pulsed laser beam LB to be applied from the focusing means 522 is set near the front side 21a (upper surface) of the functional layer 21 present on the predetermined division line 22 as shown in FIG. 9A. Thereafter, the pulsed laser beam LB having an absorption wavelength to the stacked member including the functional layer 21 and the metal films 24 is applied from the focusing means 522 to the semiconductor wafer 2, and the chuck table 51 is moved in the direction shown by an arrow X1 in FIG. 9A at a predetermined feed speed. When the other end (right end as viewed in FIG. 9B) of the predetermined division line 22 reaches the position directly below the focusing means 522, the application of the pulsed laser beam LB is stopped and the movement of the chuck table 51 is also stopped.

Figure 9C:
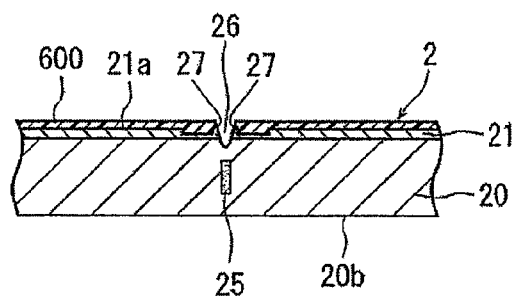

As a result, a laser processed groove 26 having a depth greater than the thickness of the functional layer 21, i.e., having a depth reaching the substrate 20 is formed on the front side of the semiconductor wafer 2 along the predetermined division line 22 as shown in FIG. 9C. Accordingly, the metal films 24 and the functional layer 21 present on the predetermined division line 22 are divided and removed by the laser processed groove 26 (stacked member removing step). At this time, as shown in FIG. 9C, the functional layer 21 and the metal films 24 are melted and rehardened to form burrs 27 projecting from both side walls of the laser processed groove 26. Further, any damage such as thermal stress and cracks due to the ablation is left on both side walls of the laser processed groove 26. The height of each burr 27 is 5 μm to 10 μm. Although debris is also generated to scatter in the stacked member removing step, the debris scattering can be blocked by the protective film 600 formed on the front side 21a of the functional layer 21, thereby preventing the debris from adhering to the devices 23.

This stacked member removing step is similarly performed along all of the other division lines 22 extending in the first direction on the front side 21a of the functional layer 21 of the semiconductor wafer 2. Thereafter, the chuck table 51 is rotated 90 degrees to similarly perform the stacked member removing step along all of the other division lines 22 extending in the second direction perpendicular to the first direction.

For example, the stacked member removing step mentioned above is performed under the following processing conditions.

Figure 10A:
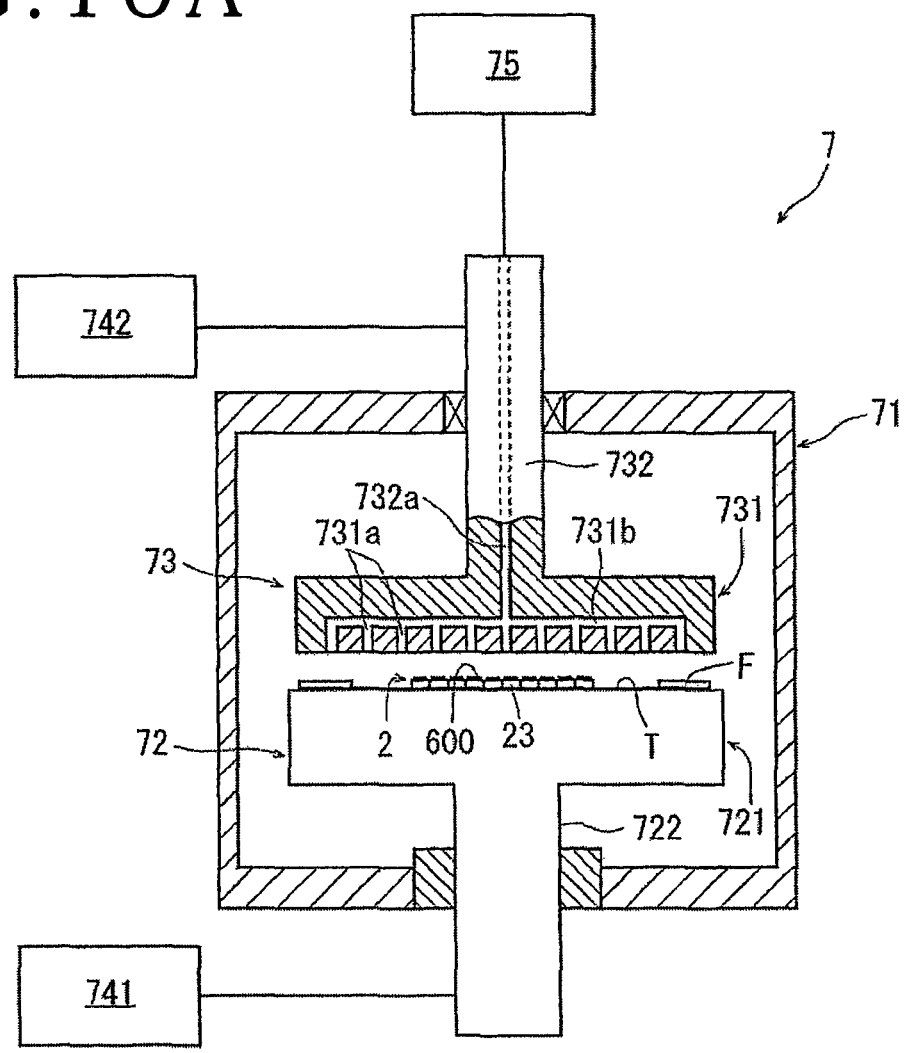
FIGS. 10A and 10B are views for illustrating a plasma etching step.

Wavelength of the laser beam: 355 nm
Repetition frequency: 40 kHz
Average power: 3 W
Focused spot diameter: 10 μm
Work feed speed: 100 mm/second After performing the stacked member removing step mentioned above, a plasma etching step is performed in such a manner that an etching gas in a plasma state is supplied to the semiconductor wafer 2 from the protective film 600 side, that is, to the front side of the semiconductor wafer 2, thereby removing the damage due to the ablation in the stacked member removing step. This plasma etching step is performed by using a plasma etching apparatus 7 shown in FIG. 10A. The plasma etching apparatus 7 shown in FIG. 10A includes a housing 71, a lower electrode 72 provided in the housing 71, and an upper electrode 73 provided in the housing 71 so as to be vertically opposed to the lower electrode 72. The lower electrode 72 is composed of a disk-shaped workpiece holding portion 721 and a cylindrical support portion 722 projecting from the center of the lower surface of the workpiece holding portion 721. The support portion 722 is connected to first radio frequency (RF) power applying means 741.

The upper electrode 73 is composed of a disk-shaped gas discharging portion 731 and a cylindrical support portion 732 projecting from the center of the upper surface of the gas discharging portion 731. The support portion 732 is connected to second RF power applying means 742. The gas discharging portion 731 of the upper electrode 73 is opposed to the workpiece holding portion 721 of the lower electrode 72. The gas discharging portion 731 of the upper electrode 73 is formed with a plurality of discharge openings 731a exposed to the lower surface of the gas discharging portion 731. The plural discharge openings 731a are in communication with gas supplying means 75 through a passage 731b formed in the gas discharging portion 731 and a passage 732a formed in the support portion 732. The gas supplying means 75 functions to supply an etching gas to the upper electrode 73, wherein the etching gas mainly includes a fluorine-based gas such as $SF_6+C_4F_8$.

In performing the plasma etching step by using the plasma etching apparatus 7, the semiconductor wafer 2 processed by the stacked member removing step is placed on the workpiece holding portion 721 of the lower electrode 72 in the condition where the semiconductor wafer 2 is supported through the adhesive tape T to the annular frame F and the adhesive tape T is in contact with the upper surface of the workpiece holding portion 721. Accordingly, the semiconductor wafer 2 is placed on the workpiece holding portion 721 in the condition where the protective film 600 formed on the front side of the semiconductor wafer 2 is oriented upward.

Figure 10B:
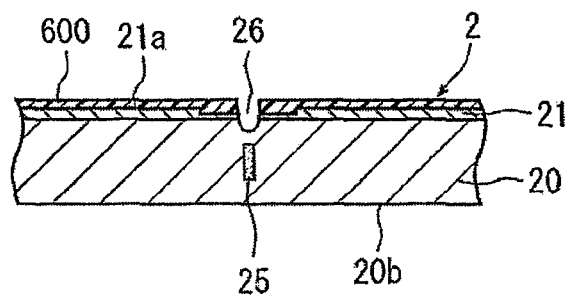

Thereafter, evacuating means (not shown) is operated to reduce the pressure in the housing 71 to 20 Pa, and the gas supplying means 75 is operated to supply the etching gas to the upper electrode 73. The etching gas is supplied from the gas supplying means 75 through the passage 732a formed in the support portion 732 and the passage 731b formed in the gas discharging portion 731 to the plural discharge openings 731a. Then, the etching gas is discharged from the plural discharge openings 731a toward the semiconductor wafer 2 held on the workpiece holding portion 721 of the lower electrode 72. In the condition where the etching gas is supplied into the housing 71, the first RF power applying means 741 is operated to apply an RF power of 50 W at 13.5 MHz to the lower electrode 72, and the second RF power applying means 742 is also operated to apply an RF power of 3000 W at 13.5 MHz to the upper electrode 73. As a result, the etching gas supplied is dissociated to generate a plasma in a space between the lower electrode 72 and the upper electrode 73. The plasma includes active substances, which act on the laser processed groove 26 formed along each division line 22 and the burrs 27 projecting from both side walls of each laser processed groove 26 as shown in FIG. 9C. As a result, the burrs 27 and the damage such as thermal stress and cracks left on the side walls of each laser processed groove 26 due to the ablation can be etched off by the active substances as shown in FIG. 10B. Accordingly, it is possible to solve the problem that the die strength of each device 23 may be reduced by the damage such as thermal stress and cracks left due to the ablation. Since the protective film 600 of water-soluble resin is formed on the front side of the semiconductor wafer 2, there is no possibility that each device 23 may be etched.

After performing the plasma etching step mentioned above, a dividing step is performed in such a manner that an external force is applied to the semiconductor wafer 2 to thereby divide the semiconductor wafer 2 into individual device chips along each division line 22 where the modified layer 25 is formed. This dividing step is performed by using a tape expanding apparatus 8 shown in FIGS. 11A and 11B.

Figure 11A:
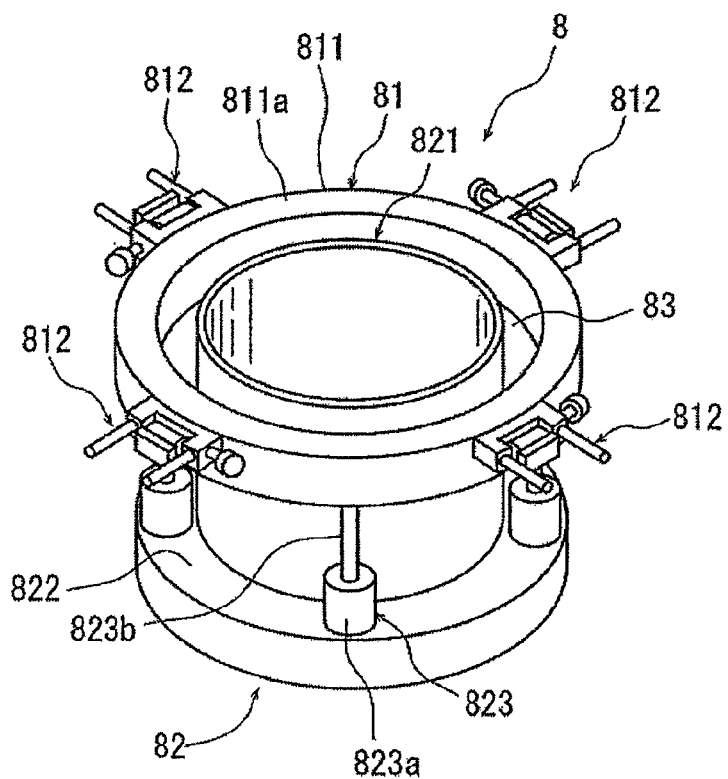
FIG. 11A is a perspective view of a tape expanding apparatus for performing a dividing step.
Figure 11B:
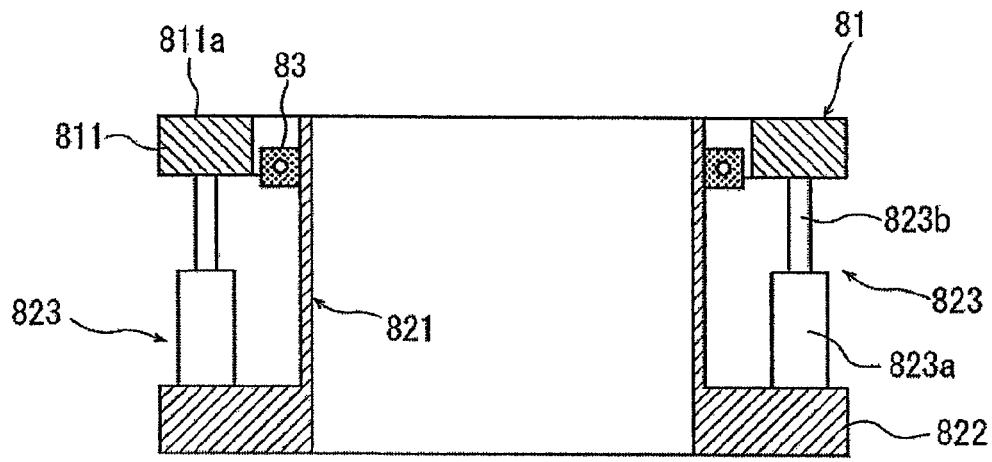
FIG. 11B is a sectional view of the tape expanding apparatus shown in FIG. 11A.

FIG. 11A is a perspective view of the tape expanding apparatus 8, and FIG. 11B is a sectional view of the tape expanding apparatus 8. The tape expanding apparatus 8 shown in FIGS. 11A and 11B includes frame holding means 81 for holding the annular frame F and tensile force applying means 82 for expanding the adhesive tape T supported to the annular frame F. The frame holding means 81 includes an annular frame holding member 811 and a plurality of clamps 812 as fixing means provided on the outer circumference of the frame holding member 811. The upper surface of the frame holding member 811 functions as a mounting surface 811a for mounting the annular frame F thereon. The annular frame F mounted on the mounting surface 811a is fixed to the frame holding member 811 by the clamps 812.

The tensile force applying means 82 includes an expanding drum 821 provided inside of the annular frame holding member 811. The expanding drum 821 has an outer diameter smaller than the inner diameter of the annular frame F and an inner diameter larger than the outer diameter of the semiconductor wafer 2 attached to the adhesive tape T supported to the annular frame F. The expanding drum 821 has a supporting flange 822 at the lower end of the expanding drum 821. The tensile force applying means 82 further includes supporting means 823 for vertically (axially) movably supporting the annular frame holding member 811. The supporting means 823 is composed of a plurality of (four in this preferred embodiment) air cylinders 823a provided on the supporting flange 822. Each air cylinder 823a is provided with a piston rod 823b connected to the lower surface of the annular frame holding member 811. The supporting means 823 composed of these plural air cylinders 823a functions to vertically move the annular frame holding member 811 so as to selectively take a reference position where the mounting surface 811a is substantially equal in height to the upper end of the expanding drum 821 and an expansion position where the mounting surface 811a is lower in height than the upper end of the expanding drum 821 by a predetermined amount.

As shown in FIG. 11B, the tape expanding apparatus 8 further includes an annular infrared heater 83 as heating means mounted on the outer circumferential surface of the expanding drum 821 at its upper portion. The infrared heater 83 functions to heat a shrink area between the inner circumference of the annular frame F and the outer circumference of the semiconductor wafer 2, in the adhesive tape T supported to the annular frame F held by the frame holding means 81.

Figure 12A:
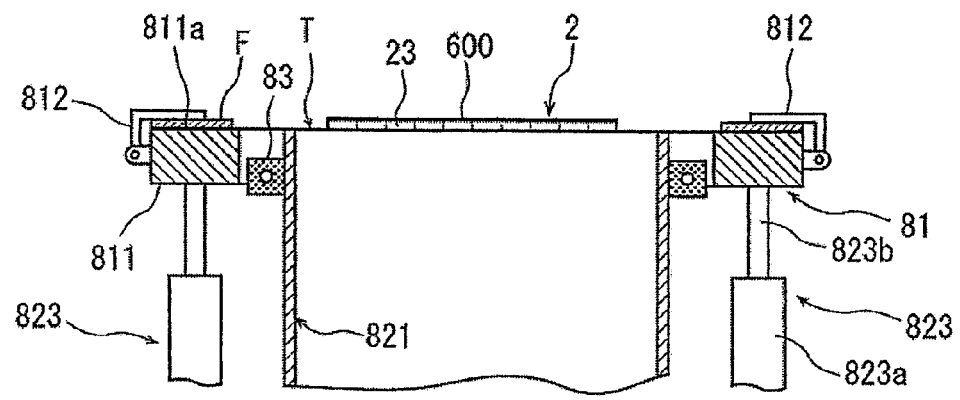
FIGS. 12A and 12B are sectional views for illustrating the dividing step.

The dividing step using the tape expanding apparatus 8 will now be described with reference to FIGS. 12A and 12B. As shown in FIG. 12A, the annular frame F supporting the semiconductor wafer 2 through the adhesive tape T is mounted on the mounting surface 811a of the frame holding member 811 of the frame holding means 81 and fixed to the frame holding member 811 by the clamps 812. At this time, the frame holding member 811 is set at the reference position shown in FIG. 12A.

Figure 12B:
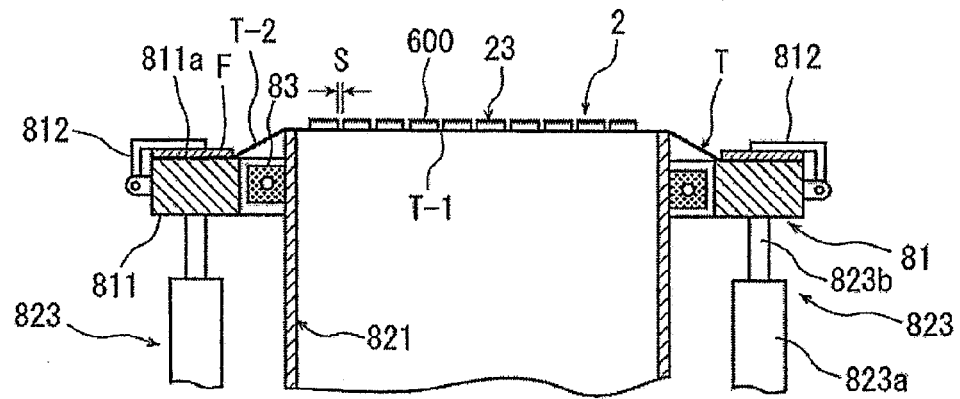

Thereafter, the air cylinders 823a as the supporting means 823 of the tensile force applying means 82 are operated to lower the frame holding member 811 to the expansion position shown in FIG. 12B. Accordingly, the annular frame F fixed to the mounting surface 811a of the frame holding member 811 is also lowered, so that the adhesive tape T supported to the annular frame F comes into abutment against the upper end of the expanding drum 821 and is expanded as shown in FIG. 12B. As a result, an area T-1 of the adhesive tape T where the semiconductor wafer 2 is attached is also expanded, so that a tensile force acts on the semiconductor wafer 2 attached to the adhesive tape T in the radial direction of the semiconductor wafer 2. Accordingly, the semiconductor wafer 2 is divided along each division line 22 where the modified layer 25 is formed as a division start point, thereby obtaining individual device chips corresponding to the devices 23 and forming a spacing S between any adjacent ones of the device chips (dividing step).

Figure 13A:
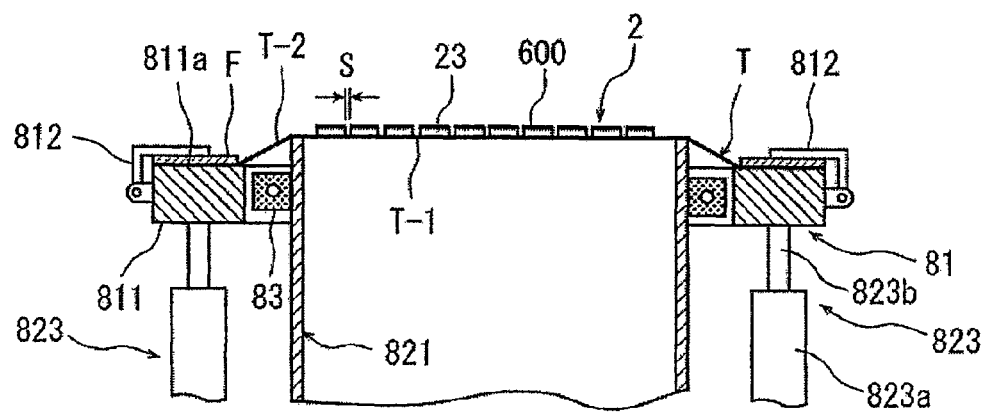
FIGS. 13A and 13B are sectional views for illustrating a device spacing maintaining step.
Figure 13B:
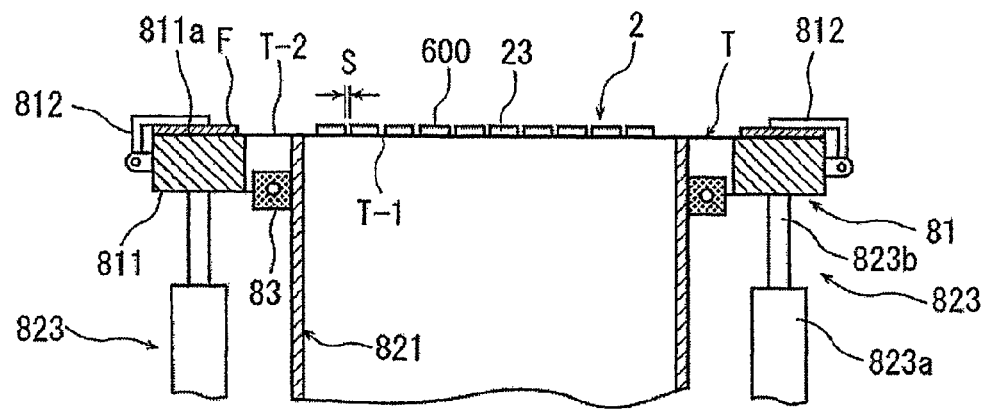

In this preferred embodiment, the dividing step of dividing the semiconductor wafer 2 into the individual device chips along each division line 22 where the modified layer 25 is formed includes a device spacing maintaining step of maintaining the spacing S between any adjacent ones of the device chips by heating a shrink area T-2 defined between the inner circumference of the annular frame F and the area T-1 where the semiconductor wafer 2 is attached, in the adhesive tape T supported to the annular frame F, thereby shrinking the shrink area T-2 of the adhesive tape T. This device spacing maintaining step is performed by operating (energizing) the infrared heater 83 in the condition where the dividing step has been finished as shown in FIG. 13A. As a result, the shrink area T-2 of the adhesive tape T between the inner circumference of the annular frame F and the area T-1 where the semiconductor wafer 2 is attached is heated to be shrunk by the infrared radiation applied by the infrared heater 83. In concert with this shrinkage of the shrink area T-2, the plural air cylinders 823a as the supporting means 823 of the tensile force applying means 82 are operated to raise the frame holding member 811 to the reference position as shown in FIG. 13B. For example, the adhesive tape T is heated by the infrared heater 83 at 70° C. to 100° C. for 5 seconds to 10 seconds. In this manner, the shrink area T-2 of the adhesive tape T is heated to be shrunk, thereby removing the slack in the adhesive tape T expanded in the dividing step. Accordingly, it is possible to maintain the spacing S formed between any adjacent ones of the individual device chips divided from each other in the dividing step.

After performing the dividing step mentioned above, a protective film removing step is performed in such a manner that the front side of the semiconductor wafer 2 is cleaned to thereby remove the protective film 600 from the front side of the semiconductor wafer 2 (each device 23). This protective film removing step is performed by using a cleaning apparatus 9 shown in FIG. 14A. The cleaning apparatus 9 shown in FIG. 14A includes a holding table 91 for holding a workpiece and a cleaning water nozzle 92 for supplying a cleaning water to the workpiece held on the holding table 91. In performing the protective film removing step by using this cleaning apparatus 9, the individual device chips attached to the adhesive tape T supported to the annular frame F are placed on the holding table 91 in the condition where the adhesive tape T is in contact with the upper surface of the holding table 91. Accordingly, the protective film 600 formed on each device chip held through the adhesive tape T on the holding table 91 is oriented upward. Thereafter, a cleaning water is supplied from the cleaning water nozzle 92 to the protective film 600 formed on each device chip attached to the adhesive tape T supported to the annular frame F. As a result, the protective film 600 of water-soluble resin can be easily removed by the cleaning water as shown in FIG. 14B.

As described above, the protective film 600 is formed of a nontoxic water-soluble resin. Accordingly, there is no possibility of environmental pollution and no dedicated disposal equipment is needed to achieve good economy. After performing the protective film removing step, a pickup step is performed to peel and pick up each device chip from the adhesive tape T.

Another preferred embodiment of the present invention will now be described. While the plasma etching step is performed after performing the stacked member removing step, and the dividing step is performed after performing the plasma etching step in the above preferred embodiment, the dividing step may be performed after performing the stacked member removing step, and the plasma etching step may be performed after performing the dividing step. In this case, the dividing step may be performed by using the tape expanding apparatus 8 shown in FIGS. 11A and 11B in such a manner as shown in FIGS. 12A to 13B. Further, the plasma etching step may be performed by using the plasma etching apparatus 7 shown in FIG. 10A.

Figure 15:
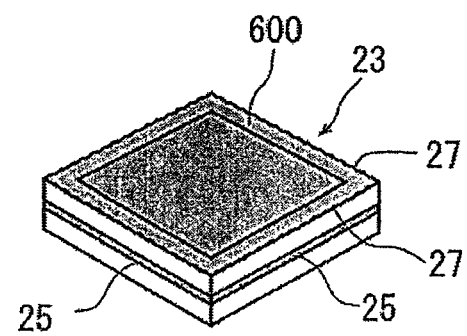
FIG. 15 is a perspective view of a device chip obtained by performing a dividing step according to another preferred embodiment of the present invention.
Figure 16:
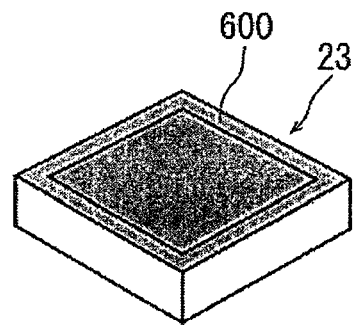
FIG. 16 is a perspective view of a device chip obtained by performing a plasma etching step after performing the dividing step shown in FIG. 15.

That is, in this other preferred embodiment, the dividing step is performed before performing the plasma etching step. In the dividing step, the semiconductor wafer 2 is divided into the individual device chips corresponding to the devices 23 along each division line 22 where the modified layer 25 is formed as a division start point as shown in FIG. 12B. At this time, the spacing S is formed between any adjacent ones of the device chips (dividing step). As shown in FIG. 15, each device chip including the device 23 has the modified layer 25 exposed to each side surface and also has the burrs 27 left on each side surface. Further, the damage such as thermal stress and cracks due to the ablation is also left on each side surface. The plasma etching step is performed after performing this dividing step. Accordingly, the active substances in the plasma act on the side surface of each device chip through the spacing S (see FIG. 13B) formed between any adjacent ones of the device chips, thereby etching off the modified layer 25, the burrs 27 (see FIG. 15), and the damage such as thermal stress and cracks due to the ablation as shown in FIG. 16. Since the protective film 600 of water-soluble resin is formed on the front side of each device chip (each device 23), each device 23 is not etched. In this manner, according to this other preferred embodiment, the modified layer 25 exposed to the side surface of each device chip can also be removed by the plasma etching step, thereby further improving the die strength of each device chip.

Figure 14A:
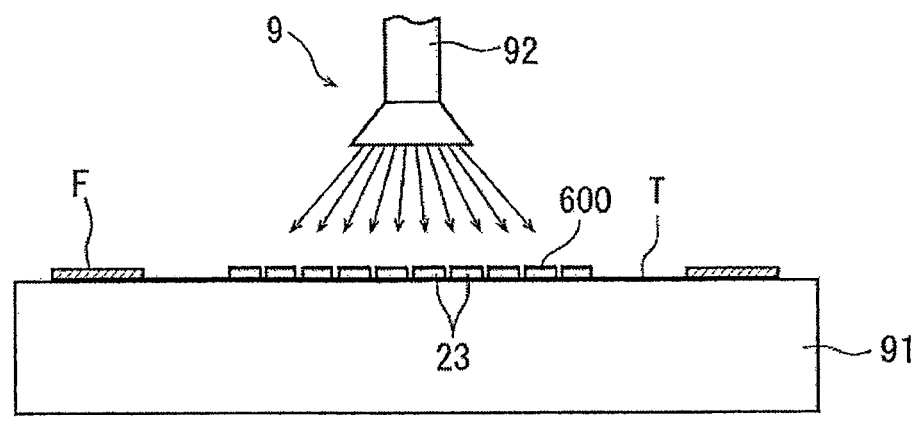
FIGS. 14A and 14B are views for illustrating a protective film removing step.
Figure 14B:
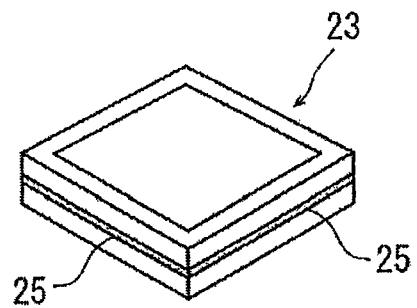

The protective film 600 formed on the front side of each device chip shown in FIG. 16 may be removed by performing the protective film removing step shown in FIG. 14A.

While the specific preferred embodiments of the present invention have been described, the present invention is not limited to the above preferred embodiments, but various modifications may be made within the scope of the present invention. For example, while the wafer used in the above preferred embodiments has such a configuration that a functional layer (stacked member) is formed on the front side of the substrate and a TEG (stacked member) is formed on a part of each division line, the wafer applicable to the present invention is not limited. For example, the wafer applicable to the present invention may have a configuration such that a functional layer is formed on the front side of the substrate and no TEG is formed on each division line or may have a configuration such that no functional layer is formed on each division line and a TEG is formed on each division line. Also in either case, a similar effect can be attained.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual device chips along a plurality of crossing division lines formed on a front side of said wafer, the front side of said wafer being partitioned by said division lines to define a plurality of separate regions where a plurality of devices are formed, said individual device chips corresponding to said devices, said wafer having a stacked member formed thereon, said wafer processing method comprising:

a protective member attaching step of attaching a protective member to the front side of said wafer;

a back grinding step of grinding a back side of said wafer after performing said protective member attaching step, thereby reducing the thickness of said wafer to a predetermined thickness;

a modified layer forming step of applying a laser beam having a transmission wavelength to said wafer from the back side thereof along each division line in the condition where the focal point of said laser beam is set inside said wafer after performing said back grinding step, thereby forming a modified layer inside said wafer along each division line;

a wafer supporting step of attaching the back side of said wafer to an adhesive tape supported at its peripheral portion to an annular frame having an inside opening capable of receiving said wafer after performing said modified layer forming step, thereby supporting said wafer through said adhesive tape to said annular frame, and next peeling said protective member from the front side of said wafer;

a protective film forming step of applying a water-soluble resin to the front side of said wafer after performing said wafer supporting step, thereby forming a protective film from said water-soluble resin;

a stacked member removing step of applying a laser beam having an absorption wavelength to said stacked member through said protective film along each division line after performing said protective film forming step, thereby performing ablation to remove said stacked member present on each division line;

a dividing step of applying an external force to said wafer after performing said stacked member removing step, thereby dividing said wafer into said individual device chips along each division line where said modified layer is formed;

a protective film removing step of cleaning the front side of said wafer after performing said dividing step, thereby removing said protective film from the front side of said wafer; and a plasma etching step of supplying an etching gas in a plasma state to said wafer from the front side thereof after performing said stacked member removing step or after performing said dividing step, thereby removing damage due to the ablation in said stacked member removing step.

* * * * *